(12) United States Patent
Ashikhmin (10) Patent No.: US 6,990,626 B2
(45) Date of Patent: Jan. 24, 2006

(54) METHOD AND APPARATUS FOR MAP DECODING OF FIRST-ORDER REED MULLER CODES AND RELATED ERROR CORRECTION CODES

(75) Inventor: Alexei Ashikhmin, Morristown, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 563 days.

(21) Appl. No.: 10/112,574

(22) Filed: Mar. 29, 2002

(65) Prior Publication Data

US 2003/0188250 A1 Oct. 2, 2003

(51) Int. Cl.
*H03M 13/03* (2006.01)

(52) U.S. Cl. ..................................... 714/794; 714/784
(58) Field of Classification Search ................. 714/797, 714/794, 786, 784, 777, 757, 752, 746
See application file for complete search history.

(56) References Cited

U.S. PATENT DOCUMENTS

| | | | | | |
|---|---|---|---|---|---|
| 5,926,488 | A | * | 7/1999 | Khayrallah | ................. 714/752 |
| 6,145,114 | A | * | 11/2000 | Crozier et al. | ............... 714/794 |
| 2002/0122510 | A1 | * | 9/2002 | Yakhnich et al. | ........... 375/342 |
| 2003/0026224 | A1 | * | 2/2003 | Kim et al. | ................... 370/335 |
| 2003/0074626 | A1 | * | 4/2003 | Coker et al. | ................. 714/752 |
| 2004/0071357 | A1 | * | 4/2004 | Cook | .......................... 382/248 |

OTHER PUBLICATIONS

J. Massey, "Deep–Space Communications and Coding: A Marriage Made in Heaven", Sep. 22–23, 1992. , url ="citeseer.ist.psu.edu/massey92deepspace.html".*

D. J. C. MacKay, "Good Error–Correcting Codes Based on Very Sparse Matrices", Information Theory, IEEE Transactions, vol. 45, Issue 2, Mar. 1999, pp. 399–431.*

Ben Cooke, "Reed–Muller Error Correcting Codes", MIT Undergraduate Journal of Mathematics, vol. 1, 1999, url ="http://www.-math.mit.edu/phase2/UJM/vol1/COOKE 7FF.PDF".*

A. Ashikhmin, et al., "Quasioptimal Biorthogonal–Code Decoding Algorithms," Radioelectronica, vol. 31, No. 11, pp. 30–34, 1988 (in Russian), English translation: Radio Electronics and Communication System, v.31, 11, pp. 26–30, 1988.

A. Ashikhmin, et al., "A List Algorithm for Locating the Maximal Element in a Walsh Spectrum," Radioelectronica, vol. 32, No. 3, pp. 15–22, 1990 (In Russian), English translation: Radio Electronics and Communication Systems, v.32, 11, pp. 37–41, 1990.

(Continued)

*Primary Examiner*—Albert Decady
*Assistant Examiner*—John P. Trimmings (57) ABSTRACT

A method and apparatus are disclosed for MAP decoding of signals encoded using error correction codes to make maximum probability decisions about each transmitted bit. A MAP decoding algorithm is disclosed that exploits properties of Reed-Muller error correction codes that use q-ary block codes to provide a decoding algorithm having a complexity that is proportional to n $\log_q$ n for Reed-Muller codes. The disclosed MAP decoding algorithm employs two matrices D and $\bar{D}$ to represent the code set and has an overall complexity that is exponential for a general code set. For Reed-Muller codes, the disclosed MAP decoding algorithm employs matrices $B_i$ and $\bar{B}_i$ that are sparse matrices (i.e., contain many zero entries), thereby reducing the number of required operations and yielding a complexity that is proportional to n $\log_q$ n. In addition, the disclosed MAP decoding algorithm permits faster decoding by permitting a parallel implementation having a critical path length that is proportional to 2 $\log_q$ n for Reed-Muller codes.

20 Claims, 4 Drawing Sheets

OTHER PUBLICATIONS

A. Ashikhmin, et al., "Fast Decoding of First Order Reed–Muller and Related Codes," Designs, Codes and Cryptography, vol. 7, pp. 187–215, 1996.

L. R. Bahl, et al., "Optimal Decoding of Linear Codes for Minimizing Symbol Error Rate," IEEE Trans. Inf. Theory, vol. IT–20, pp. 284–287, Mar. 1974.

Y. Be'ery et al., "Optimal Soft Decision Block Decoders Based on Fast Hadamard Transform," IEEE Trans. on Inf. Theory, vol. IT–32, pp. 355–364, 1986.

P. Delsarte, J.–M.Goethals and F.J.MacWilliams, "On generalized Reed–Muller codes and their relatives," Info.and Control, vol.16, pp. 403–442, 1974.

R. R. Green, "A Serial Orthogonal Decoder," JPL Space Programs Summary, vol. 37–39–IV, pp. 247–253, 1966.

I. J. Good, "The Interaction Algorithm and PracticalFourier Analysis," J.Royal Stat. Soc., (London)1958. vol. B–20. pp. 361–372.

I.Grushko, "Majority–Logic Decoding of Generalized Reed–Muller Codes," Problemy Peredachi Informatsii, vol. 26, pp. 189–196, 1990.

T. Kasami, et al., "New Generalizations of the Reed–Muller codes, Part 1: Primitive codes," IEEE Trans. on Inf. Theory, vol. IT–14, pp. 189–199, 1968.

T. Kasami, et al., "On the optimum bit orders with respect to the state complexity of trellis diagrams for binary linear codes," IEEE Trans. Inf. Theory, vol. IT–39, pp. 242–245, Jan. 1993.

T. Kasami, et al., "On Complexity of Trellis Structure of Linear Block Codes," IEEE Trans. Inf. Theory, vol. IT–39, pp. 1057–1064, Jan. 1993.

S.Litsyn, et al., "Fast Decoding of First Order Reed–Muller Codes in the Gaussian Channel," Problems of Control and Information Theory, vol. 14, No. 3, pp. 189–201, 1985.

D. E. Muller, "Application of Boolean Algebra to Switching Circuit Design and to Error Detection," IEEE Trans. Computers, vol. 3, pp. 6–12, 1954.

I. S. Reed, "A Class of Multiple–Error–Correcting Codes and the Decoding Scheme," IEEE Trans. Inf. Theory, vol. IT–4, pp. 38–49, 1954.

* cited by examiner-

METHOD AND APPARATUS FOR MAP DECODING OF FIRST-ORDER REED MULLER CODES AND RELATED ERROR CORRECTION CODES

FIELD OF THE INVENTION

The present invention relates to mechanisms for maximum a posteriori (MAP) decoding of signals encoded using error correction codes, and, more particularly, to MAP decoding of signals encoded using Reed-Muller codes.

BACKGROUND OF THE INVENTION

Error correction codes are often employed in communication systems to provide increased resilience to channel noise. Generally, error correction encoding techniques typically employ convolutional, block or concatenated coding of the data before the signal is modulated so that errors introduced by noise and interference on the channel may be corrected. One popular family of linear low rate error correction codes having large minimum distances is first order Reed-Muller codes. Many other codes of higher rates can be considered as unions of cosets of first order Reed-Muller codes. These codes can also be used in concatenation with other codes. For a discussion of Reed-Muller codes see, for example, Y. Be'ery and J. Snyders, "Optimal Soft Decision Block Decoders Based On Fast Hadamard Transform," IEEE Trans. on Inf. Theory, v. IT-32, 355–364 (1986); or R. R. Green, "A Serial Orthogonal Decoder," JPL Space Programs Summary, v. 37–39-IV, 247–253 (1966), each incorporated by reference herein.

The received signal, which is typically corrupted by the noise and interference on the channel, must be decoded at the receiver. Typically, maximum a posteriori (MAP) decoding techniques are applied to decode signals encoded using error correction codes to make maximum probability decisions about each transmitted bit. For a detailed discussion of conventional decoding techniques for Reed-Muller codes see, for example, A. Ashikhmin and S. Litsyn, "Fast Decoding of First Order Reed-Muller and Related Codes," Designs, Codes and Cryptography, vol. 7, pp. 187–215, 1996.

One particular implementation of the MAP decoding algorithm, commonly referred to as the BCJR algorithm, was proposed in L. R. Bahl, J. Cocke, F. Jelinek and J. Raviv, "Optimal Decoding of Linear Codes for Minimizing Symbol Error Rate", IEEE Trans. Inform. Theory, V. IT-20, 284–287 (March, 1974), incorporated by reference herein. The BCJR algorithm is a symbol-by-symbol decoder based on a trellis representation of a code. The BCJR algorithm for binary first order Reed-Muller codes has a complexity that is proportional to $n^2$, where n is the code length.

A need exists for a MAP decoding technique having reduced complexity. A further need exists for a MAP decoding technique that permits faster decoding by permitting a parallel implementation.

SUMMARY OF THE INVENTION

Generally, a method and apparatus are disclosed for MAP decoding of signals encoded using error correction codes to make maximum probability decisions about each transmitted bit. In one particular implementation, a MAP decoding algorithm is disclosed that exploits properties of Reed-Muller error correction codes to provide a decoding algorithm with significantly reduced complexity. While conventional decoding algorithms, such as the BCJR algorithm, for binary first order Reed-Muller codes have a complexity that is proportional to $n^2$, where n is the code length, the disclosed decoding algorithm has a complexity that is proportional to n log n for Reed-Muller codes.

The disclosed MAP decoding algorithm determines the probability that a given symbol is each possible value and selects a value for each symbol based on the value having the maximum probability. The disclosed MAP decoding algorithm employs two matrices D and $\overline{D}$ that are $q^{k-1} \times n$ matrices to represent the code set, where q is the number of possible code values (e.g., q equals two in a binary implementation), n is the code length and k is the number of information symbols. The disclosed algorithm requires $q^{k-1}q(n-1)$ summations of real numbers and has an overall complexity that is exponential for a general code set.

When applied to Reed-Muller codes, however, the disclosed MAP decoding algorithm employs matrices $B_i$ and $\overline{B_i}$ that are sparse matrices (i.e., contain many zero entries). Thus, the number of required operations and the complexity are greatly reduced and has a complexity that is proportional to n log n. In addition, the disclosed MAP decoding algorithm permits faster decoding by permitting a parallel implementation. While conventional decoding algorithms, such as the BCJR algorithm, for binary first order Reed-Muller codes have a critical path length that is proportional to n, the disclosed decoding algorithm has a critical path length that is proportional to 2 log n for Reed-Muller codes.

A more complete understanding of the present invention, as well as further features and advantages of the present invention, will be obtained by reference to the following detailed description and drawings.

DETAILED DESCRIPTION

Figure 1:
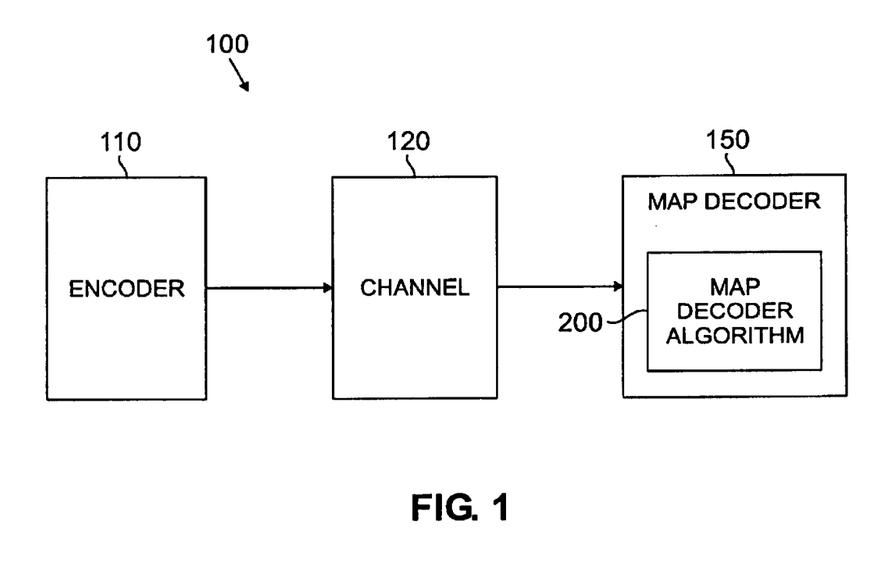
FIG. 1 illustrates a communication system in which the present invention may be employed.

FIG. 1 illustrates a communication system 100 in which the present invention may be employed. As shown in FIG. 1, the communication system 100 includes an encoder 110, a channel 120, and a maximum a posteriori (MAP) decoder 150. The encoder 110 employs error correction encoding to provide increased resilience to noise on the channel 120. In particular, the encoder 110 employs Reed-Muller encoding using q-ary block codes. As discussed hereinafter, the MAP decoder 150 employs MAP decoding algorithm 200, discussed below in conjunction with FIG. 2, incorporating features of the present invention to make maximum probability decisions for all values of each transmitted symbol.

Figure 3:
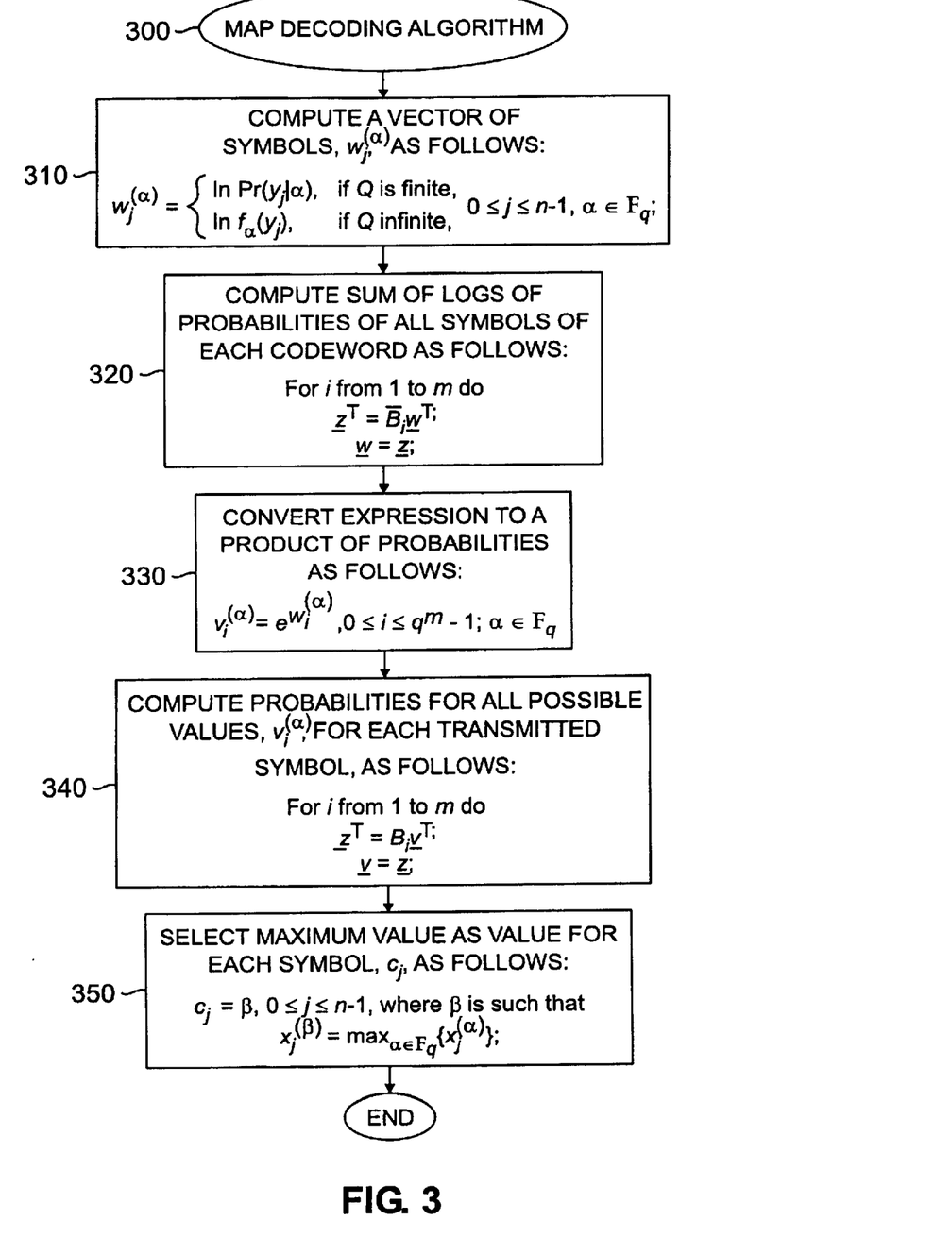
FIG. 3 is a flow chart describing an exemplary implementation of a MAP decoding algorithm particularly suited for decoding Reed-Muller codes.

According to another aspect of the invention, a MAP decoding algorithm 300, discussed below in conjunction with FIG. 3, is disclosed to decode Reed-Muller codes. The present invention recognizes that for first order Reed-Muller codes, the complexity of the general MAP decoding algorithm 200 can be significantly reduced. As discussed more fully below, the disclosed MAP decoding algorithm 300 for Reed-Muller codes has a complexity that is proportional to $q^2 n \log_q n$.

While the present invention is illustrated herein using exemplary Reed-Muller codes, the present invention may be applied to any error correction code. As discussed hereinafter, the present invention is particularly useful for Reed-Muller codes and other codes that may be represented as a product of sparse matrices.

Conventional MAP Decoding of a Linear Code

Let $F_q$ be the Galois field of size q (i.e., a finite field of q elements) and let C be an [n,k] linear code over $F_q$. It is assumed that codewords of C are transmitted through a memoryless channel 120. Let Q be an output sampling space, either finite or infinite, of the channel 120. In the case of finite Q, it is assumed that conditional probabilities $Pr(y|\alpha)$ of receiving symbol $y \in Q$ under the condition that symbol $\alpha \in F_q$ has been transmitted are known. If Q is infinite, then y is a continuous random variable whose density function, say $f_\alpha(y)$, is defined by a transmitted symbol $\alpha \in F_q$. For instance, if a binary code with binary modulation is used in a channel 120 with white additive Gaussian noise then we have two density functions:

$$f_0(y) = \frac{1}{\sqrt{2\pi\sigma}} e^{-\frac{(x-1)^2}{2\sigma^2}} \text{ and } f_1(y) = \frac{1}{\sqrt{2\pi\sigma}} e^{-\frac{(x+1)^2}{2\sigma^2}}$$

$$\text{where } \sigma = \frac{n}{2k\vartheta}$$

and θ is the signal to noise ratio. It is assumed that functions $f_\alpha(y)$ are known for all $\alpha \in F_q$. Since a memoryless channel is assumed, the conditional probability of receiving a vector $\underline{y} \in Q^n$ under the condition that a vector $\underline{c} \in F_q^n$ has been transmitted, can be written as the following product:

$$Pr(\underline{y}|\underline{c}) = \prod_{j=0}^{n-1} Pr(y_j|c_j). \quad (1)$$

It is also assumed that all codewords have the same probability to be transmitted and therefore this probability equals $$\frac{1}{q^k}.$$

It is assumed that a vector $\underline{c} = (c_0, c_1, \ldots, c_{n-1}) \in C$ is transmitted and a vector $\underline{y} \in Q^n$ is received. The goal is to determine what was the j-th transmitted symbol. To do this, the conditional probabilities $Pr(c_j = \alpha|\underline{y})$ are estimated for all $\alpha \in F_q$ and the maximum one is selected.

Let $$C_j^{(\alpha)} = \{\underline{c} = (c_0, c_1, \ldots, c_{n-1}) \in C : c_j = \alpha\}, \text{ i.e., } C_j^{(\alpha)}$$

is the set of all codewords whose j-th symbol is α. In the case of finite Q, using Bayes rule and equation (1), the conditional probabilities can be expressed as follows:

$$Pr(c_j = \alpha|\underline{y}) = \sum_{\underline{b} \in C_j^{(\alpha)}} Pr(\underline{c} = \underline{b}|\underline{y}) \quad (2)$$

$$= \sum_{\underline{b} \in C_j^{(\alpha)}} \frac{Pr(\underline{y}|\underline{b})}{Pr(\underline{y})} Pr(\underline{b})$$

$$= \frac{1}{q^k Pr(\underline{y})} \sum_{\underline{b} \in C^{(\alpha)}} \prod_{l=0}^{n-1} Pr(y_l|b_l).$$

Using similar arguments, in the case of infinite Q, the conditional probabilities can be expressed as follows:

$$Pr(c_j = \alpha|\underline{y}) = \frac{1}{q^k Pr(\underline{y})} \sum_{\underline{b} \in C_j^{(\alpha)}} \prod_{l=0}^{n-1} f_{b_l}(y_l). \quad (3)$$

The denominator of equations (2) and (3) is the same for a $\alpha \in F_q$. Therefore, for MAP decoding, it is enough to estimate only the sum of products of $Pr(y_j|b_j)$ or $f_{b_j}(y_1)$ for different $\alpha \in F_q$ and to select the maximum one.

Group Algebra Description of MAP Decoding

In one implementation of the present invention, Group algebra techniques are employed to more conveniently manipulate an array containing probabilities of each possible value of the received symbol in an appropriate manner. In the following discussion, the symbols $\cdot$, $\oplus$, and $\ominus$ are used to denote multiplication, addition, and subtraction in $F_q$, respectively. To simplify the notation, integer numbers and indexes, such as i, j, etc. are used either as natural numbers or as elements of $F_q$, whose meaning will be clear from the context in a given expression.

Let x be a formal variable. The set of monomials $x^\alpha, \alpha \in F_q$, form a multiplicative group G. The group G and the additive group of $F_q$ are isomorphic. Additions in $F_q$ correspond to multiplications in G. All formal sums:

$$\sum_{\alpha \in F_q} a^{(\alpha)} x^\alpha, \, a^{(\alpha)} \in \mathbb{R},$$

form the group algebra, say G[R]. Additions and multiplications in G[R] are defined as follows $$\sum_{\alpha \in F_q} a^{(\alpha)} x^\alpha + \sum_{\alpha \in F_q} b^{(\alpha)} x^\alpha = \sum_{\alpha \in F_q} (a^{(\alpha)} + b^{(\alpha)}) x^\alpha,$$

$$\sum_{\alpha \in F_q} a^{(\alpha)} x^\alpha \cdot \sum_{\beta \in F_q} b^{(\beta)} x^\beta = \sum_{\alpha,\beta \in F_q} a^{(\alpha)} b^{(\beta)} x^{\alpha \oplus \beta}$$

$$= \sum_{\alpha \in F_q} x^\alpha \sum_{\beta \in F_q} a^{(\beta)} b^{(\alpha \ominus \beta)}.$$

A bold font is used to denote elements of G[R]. Thus, if v, w, z ∈ G[R] then:

$$(vw)z = v(wz) \text{ and } v(w+z) = vw + vz. \quad (4)$$

It is assumed that C contains all-one codeword and let $\hat{C}$ be an [n,k−1] subcode of C such that $(1,1,\ldots,1) \notin \hat{C}$. It is assumed that codewords of $\hat{C}$ are enumerated by integers 0,1,2, . . . and that the all-zero codeword has the index 0. The j-th symbol of the i-th codeword of $\hat{C}$ is denoted as $c_{i,j}$.

Let D and $\overline{D}$ be $q^{k-1} \times n$ matrices associated with the code $\hat{C}$ and defined as follows:

$$D = [d_{i,j}] = [x^{c_{i,j}}] \text{ and } \overline{D} = [\overline{d}_{i,j}] = [x^{\ominus c_{i,j}}]. \tag{5}$$

For example, if $\hat{C}$ is a code over $F_3$ consisting of the following three vectors: (0,0,0),(1,1,2),(2,2,1), then matrices D and $\overline{D}$ are expressed as follows:

$$D = \begin{pmatrix} x^0 & x^0 & x^0 \\ x^1 & x^1 & x^2 \\ x^2 & x^2 & x^1 \end{pmatrix} \text{ and } \overline{D} = \begin{pmatrix} x^0 & x^0 & x^0 \\ x^{\ominus 1} & x^{\ominus 1} & x^{\ominus 2} \\ x^{\ominus 2} & x^{\ominus 2} & x^{\ominus 1} \end{pmatrix}.$$

It is noted that entries of D and $\overline{D}$ are from G[R]. As previously indicated, it is assumed that a codeword $\underline{c} \in C$ has been transmitted and a vector $\underline{y} \in Q^n$ has been received from the channel. Consider the case of finite Q. The vector $\underline{w} = (w_0, w_1, \ldots, w_{n-1}) \in G[R]^n$, is computed on the basis of the vector $\underline{y}$, where:

$$w_i = \sum_{\alpha \in F_q} w_i^{(\alpha)} x^\alpha = \sum_{\alpha \in F_q} \ln Pr(y_i | \alpha) x^\alpha, \text{ i.e., } w_i^{(\alpha)} = \ln Pr(y_i | \alpha).$$

Let $$\underline{t}^T = \begin{bmatrix} t_0 \\ t_1 \\ \vdots \\ t_{q^{k-1}-1} \end{bmatrix} = \overline{D} \underline{w}^T = \overline{D} \begin{bmatrix} w_0 \\ w_1 \\ \vdots \\ w_{n-1} \end{bmatrix}.$$

It is noted that here all operations are fulfilled in G[R] and $$t_i = \sum_{\alpha \in F_q} t_i^{(\alpha)} x^{(\alpha)} \in G[R].$$

Proposition 1:

$$t_i^{(\alpha)} = \ln Pr(\underline{y} | \underline{c}_i \oplus (\alpha, \alpha, \ldots, \alpha)).$$

Proof:

$$t_i = \sum_{j=0}^{n-1} x^{\ominus c_{i,j}} w_j$$

$$= \sum_{j=0}^{n-1} x^{\ominus c_{i,j}} \sum_{\alpha \in F_q} w_j^{(\alpha)} x^\alpha$$

$$= \sum_{\alpha \in F_q} x^\alpha \sum_{j=0}^{n-1} w_j^{(\alpha \oplus c_{i,j})}$$

$$= \sum_{\alpha \in F_q} x^\alpha \sum_{j=0}^{n-1} \ln Pr(y_j | \alpha \oplus c_{i,j})$$

$$= \sum_{\alpha \in F_q} x^\alpha \ln \prod_{j=0}^{n-1} Pr(y_j | \alpha \oplus c_{i,j})$$

$$= \sum_{\alpha \in F_q} \ln Pr(\underline{y} | \underline{c}_i \oplus (\alpha, \alpha, \ldots, \alpha)) x^\alpha.$$

The vector $(v_0, v_1, \ldots, v_{n-1}) \in G[R]$ is now formed, where:

$$v_i = \sum_{\alpha \in F_q} v_i^{(\alpha)} x^\alpha = \sum_{\alpha \in F_q} e_i^{(\alpha)} x^\alpha = \sum_{\alpha \in F_q} Pr(\underline{y} | \underline{c}_i \oplus (\alpha, \alpha, \ldots, \alpha)) x^\alpha.$$

Let $$\underline{s}^T = \begin{bmatrix} s_0 \\ s_1 \\ \vdots \\ s_{n-1} \end{bmatrix} = D^T \underline{v}^T = D^T \begin{bmatrix} v_0 \\ v_1 \\ \vdots \\ v_{q^{k-1}-1} \end{bmatrix}.$$

Then the following proposition results:

Proposition 2:

$$s_j^{(\alpha)} = \sum_{\underline{b} \in C_j^{(\alpha)}} Pr(\underline{y} | \underline{b}).$$

Proof:
The proof is similar to the proof of the previous proposition.

Let Q be infinite. The vector $\underline{w} = (w_0, w_1, \ldots, w_{n-1}) \in G[R]^n$ is defined as follows:

$$w_i = \sum_{\alpha \in F_q} w_i^{(\alpha)} x^\alpha = \sum_{\alpha \in F_q} \ln f_\alpha(y_j) x^\alpha.$$

Using the same arguments as discussed above in conjunction with Propositions 1 and 2, the following is obtained:

$$t_i^{(\alpha)} = \prod_{j=0}^{n-1} \ln f_{c_{i,j} \oplus \alpha}(y_j), \tag{6}$$

$$s_j^{(\alpha)} = \sum_{\underline{b} \in C_j^{(\alpha)}} \prod_{l=0}^{n-1} \ln f_{b_l \oplus \alpha}(y_l). \tag{7}$$

From definitions (2) and (3) of MAP decoding, Propositions 1 and 2, and equations (6) and (7), it follows that the following algorithm is the MAP decoding of the code C.

Figure 2:
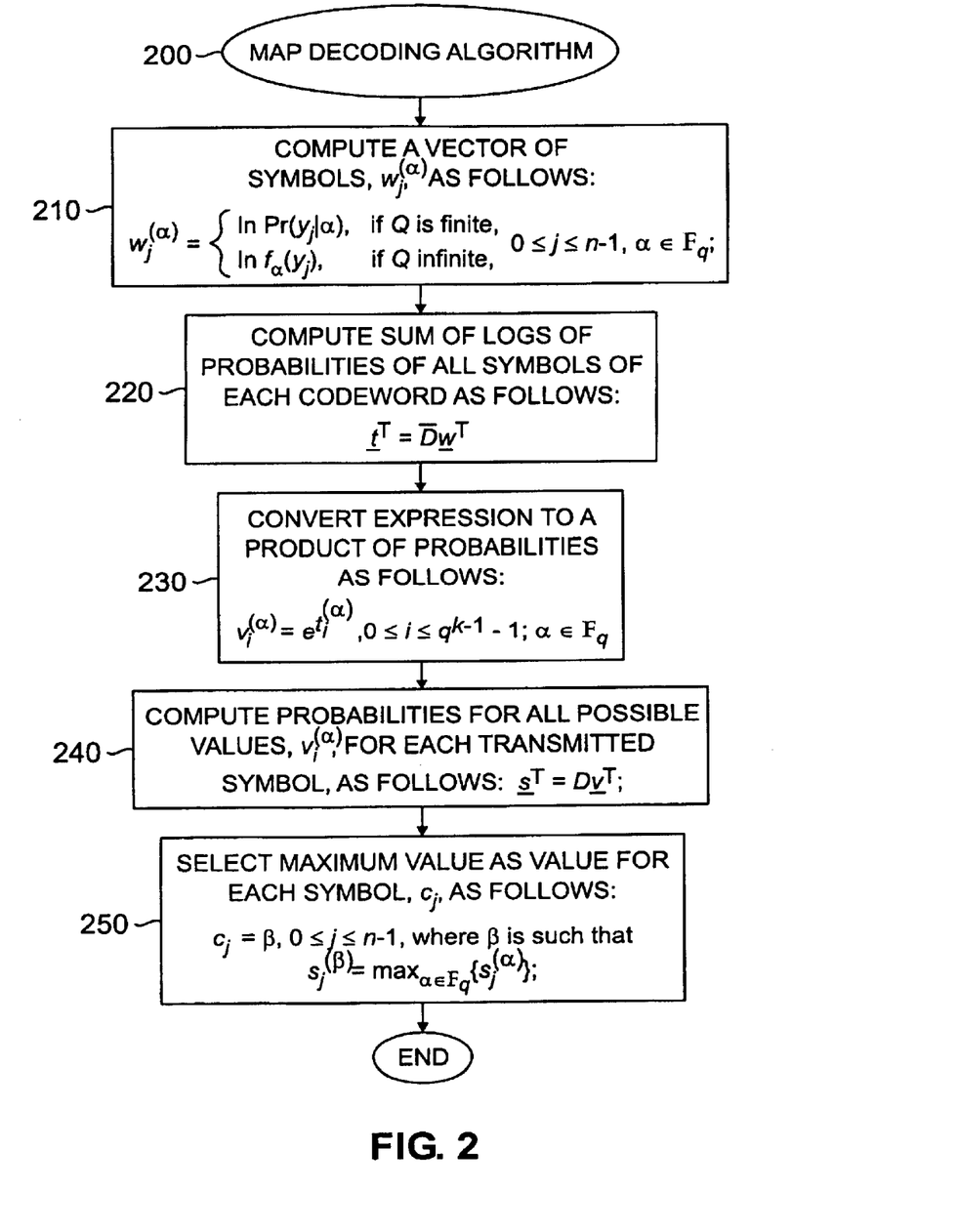
FIG. 2 is a flow chart describing an exemplary implementation of the MAP decoding algorithm of FIG. 1 incorporating features of the present invention.

FIG. 2 is a flow chart describing an exemplary implementation of the MAP decoding algorithm 200 incorporating features of the present invention. It is noted that the exemplary MAP decoding algorithm 200 uses the sum of logarithms of probabilities, as opposed to an equivalent product of probabilities, as would be apparent to a person of ordinary skill. As shown in FIG. 2, the MAP decoding algorithm 200 initially computes a vector of symbols, $w_j^\alpha$, having group algebra elements during step 210, based on the received signal, as follows:

$$w_j^{(\alpha)} = \begin{cases} \ln Pr(y_i | \alpha), & \text{if } Q \text{ if finite} \\ \ln f_\alpha(y_j), & \text{if } Q \text{ is infinite} \end{cases}, 0 \leq j \leq n-1, \alpha \in F_q;$$

Thereafter, the sum of the logs of the probabilities of all symbols of each codeword is obtained during step 220 by multiplying the vector of symbols, $w_j^\alpha$; by a matrix, $\overline{D}$, associated with the codeset, as follows:

$$\underline{t}^T = \overline{D} \underline{w}^T.$$

The obtained expression is converted to a product of the probabilities for each code word, $v_i^{(\alpha)}$, during step 230 as follows:

$$v_i^{(\alpha)} = e^{t_i^{(\alpha)}}, 0 \le i \le q^{k-1} - 1; \alpha \in \mathbb{F}_q.$$

The product of the probabilities for each possible value, $$v_i^{(\alpha)},$$

is multiplied by the matrix D, during step 240, as follows:

$$\underline{s}^T = D^T \underline{v};$$

to obtain the vector $\underline{s}^T$, indicating the probabilities for a given symbol to be each possible value.

Finally, a value is selected for each symbol, $c_j$, during step 250, by selecting the maximum value, as follows:
$c_j = \beta$, $0 \le j \le n-1$, where $\beta$ is such that $$s_j^{(\beta)} = \max_{\alpha \in \mathbb{F}_q} \{s_j^{(\alpha)}\};$$

To estimate the complexity of the algorithm 200, let $$w = \sum_{\alpha \in \mathbb{F}_q} w^{(\alpha)} x^\alpha \text{ be}$$

an arbitrary element of G[R]. Let $y = x^\beta$, $\beta \in \mathbb{F}_q$, i.e., $\underline{y}$ is an element of G[R] of a special form. Then the following multiplication:

$$yw = \sum_{\alpha \in \mathbb{F}_q} w^{(\alpha \ominus \beta)} x^\alpha,$$

is a permutation of terms in w. For this reason, the complexity of such kind of multiplication is zero. Let $z = x^\gamma$ and $(w_0, w_1) \in G[R]^2$. The multiplication of the vectors:

$$(y, z)\binom{w_0}{w_1} = \sum_{\alpha \in \mathbb{F}_q} w_0^{\alpha \ominus \beta} x^\alpha + \sum_{\alpha \in \mathbb{F}_q} w_1^{\alpha \ominus \gamma} x^\alpha = \sum_{\alpha \in \mathbb{F}_q} (w_0^{\alpha \ominus \beta} + w_1^{\alpha \ominus \gamma}) x^\alpha$$

requires q summations of real numbers. In general, multiplication of a vector $(y_0, \ldots, y_{n-1}) \in G[R]^n$ whose entries have the form $y_j = x^{\beta_j}$, $\beta_j \in \mathbb{F}_q$, by a vector $(w_0, \ldots, w_{n-1}) \in G[R]^n$ requires $(n-1)q$ real summations.

Matrices D and $\overline{D}$ are $q^{k-1} \times n$ matrices whose entries are of the form $x^\beta$, $\beta \in \mathbb{F}_q$. Hence, steps 220 and 240 of the algorithm require $q^{k-1}q(n-1)$ summations of real numbers. Steps 210, 230, and 250 of the algorithm have linear complexity. Hence, the overall complexity of the algorithm is exponential.

MAP Decoding of Reed-Muller Codes

As previously indicated, the present invention also includes a MAP decoding algorithm 300 for decoding Reed-Muller codes. The present invention recognizes that for first order Reed-Muller codes, the complexity of the general MAP decoding algorithm 200 can be significantly reduced.

The q-ary first order Reed-Muller code RM(q,m) is a q-ary linear code of length $n = q^m$, dimension $k = m+1$, and minimum distance $d = q^m - q^{m-1}$. These codes are optimal, i.e., they have the maximum possible minimum distance for given length and dimension. The binary Reed-Muller codes were defined in D. E. Muller, "Application of Boolean Algebra to Switching Circuit Design and to Error Detection," IEEE Trans. Computers, v. 3, 6–12 (1954) and I. S. Reed, "A Class of Multiple-Error-Correcting Codes and the Decoding Scheme," IEEE Trans. Inf. Theory, v. IT-4, 38–49 (1954) and nonbinary Reed-Muller codes were defined in P. Delsarte et al., "On Generalized Reed-Muller Codes and Their Relatives," Info. and Control, v. 16, 403–42 (1974); and T. Kasami et al., "New Generalizations of the Reed-Muller Codes, Part 1: Primitive Codes," IEEE Trans. on Inf. Theory, v. IT-14, 189–99 (1968).

The following formal definition of RM(q,m) is convenient. The indexes $0 \le j \le q^m - 1$ and $0 \le i \le q^{m+1} - 1$ may be expressed in the form:

$$j = j_0 + j_1 q + \ldots + j_{m-1} q^{m-1}, 0 \le j_1 \le q-1,$$

$$i = i_0 + i_1 q + \ldots + i_{m-1} q^{m-1} + r q^m, 0 \le i_1, r \le q-1.$$

Then, the j-th symbol of the i-th codeword of RM(q,m) is defined as follows:

$$c_{i,j} = i_0 \cdot j_0 \oplus i_1 \cdot j_1 \oplus \ldots \oplus i_{m-1} \cdot j_{m-1} \oplus r.$$

Similar to the previous section, we denote by $\widehat{RM}(q,m)$ a $[q^m, m]$ linear subcode of RM(q,m) that does not contain the vector (1,1,...,1). Thus, in $\widehat{RM}(q,m)$ j-th symbol of i-th codeword is defined as follows:

$$c_{i,j} = i_0 \cdot j_0 \oplus i_1 \cdot j_1 \oplus \ldots \oplus i_{m-1} \cdot j_{m-1}$$

For example, if q=3, m=2, and i=7 then
$\underline{c}_7 = (0,1,2,2,0,1,1,2,0)$.

In the following discussion, the Kronecker product of matrices is needed.

Definition 1:

If $A = [a_{i,j}]$ and $B = [b_{i,j}]$ are t×t and s×s matrices, respectively, then the Kronecker product of A and B, denoted as $A \otimes B$, is the ts×ts matrix given by $$A \otimes B = \begin{bmatrix} a_{0,0}B & a_{0,1}B & \cdots & \cdots & a_{0,t-1}B \\ a_{1,0}B & a_{1,1}B & \cdots & \cdots & a_{1,t-1}B \\ \vdots & \vdots & \ddots & \ddots & \vdots \\ \vdots & \vdots & \ddots & \ddots & \vdots \\ a_{t-1,0}B & a_{t-1,1}B & \cdots & \cdots & a_{t-1,t-1}B \end{bmatrix}.$$

In other words, $A \otimes B$ is obtained by replacing every entry $a_{i,j}$ by $a_{i,j}B$. The following properties of the Kronecker product are well known:

$$(A \otimes B)(C \otimes D) = AC \otimes BD, \quad (8)$$

$$(A \otimes B) \otimes C = A \otimes (B \otimes C). \quad (9)$$

$E = [e_{i,j}] = A \otimes B$. i and j are represented in the form:

$$i = i_0 s + i_1, 0 \le i_0 \le t-1, 0 \le i_1 \le s-1,$$

$$j = j_0 s + j_1, 0 \le j_0 \le t-1, 0 \le j_1 \le s-1. \quad (10)$$

Thus, from the definition of the Kronecker product:

$$e_{i,j} = a_{i_0, j_0} b_{i_1, j_1}. \quad (11)$$

Let $F=[f_{i,j}]$ be a q×q matrix whose entries are defined as follows $f_{i,j}=x^{i \cdot j}$, $0 \leq i, j \leq q-1$. It is noted that in this definition i and j are considered as elements of $F_q$ and entries of F are from G[R]. If, for instance, q=3, then:

$$F = \begin{bmatrix} x^0 & x^0 & x^0 \\ x^0 & x^1 & x^2 \\ x^0 & x^2 & x^1 \end{bmatrix}.$$

Similarly, $\overline{F}=[\overline{f}_{i,j}]$, where $\overline{f}_{i,j}=x^{\ominus(i \cdot j)}$. Let D and $\overline{D}$ be matrices defined by equation (5) for the code $\widehat{RM}(q,m)$.

Lemma 3:

$$D = \underbrace{F \otimes F \otimes \ldots \otimes F}_{m \text{ times}} \text{ and } \overline{D} = \underbrace{\overline{F} \otimes \overline{F} \otimes \ldots \otimes \overline{F}}_{m \text{ times}}.$$

Proof:
Let $$E = [e_{i,j}] = \underbrace{F \otimes F \otimes \ldots \otimes F}_{m \text{ times}},$$

$0 \leq i, j \leq q^m-1$ ... Similar to equation (11), we have $$e_{i,j} = \prod_{l=0}^{m-1} f_{i_l, j_l}, \text{ where}$$

$i = i_0 q^{m-1} + i_1 q^{m-2} + \ldots + i_{m-1}$, $0 \leq i_1 \leq q-1$, $j = j_0 q^{m-1} + j_1 q^{m-2} + \ldots + j_{m-1}$, $0 \leq j_1 \leq q-1$.

Hence, $$e_{i,j} = \prod_{l=0}^{m-1} f_{i_l, j_l} = \prod_{l=0}^{m-1} x^{i_l \cdot j_l} = x^{i_0 \cdot j_0 \oplus i_1 \cdot j_1 \oplus \ldots \oplus i_{m-1} \cdot j_{m-1}} = x^{c_{i,j}} d_{i,j}.$$

The proof of the second equation is similar.

The n×n diagonal matrix, denoted by $I_{n^2}$, has diagonal entries $x^0$. Let us define the matrices $B_i = I_{2^{m-i}} \otimes F \otimes I_{2^{i-1}}$ and $\overline{B}_i = I_{2^{m-i}} \otimes \overline{F} \otimes I_{2^{i-1}}$, $1 \leq i \leq m$.

Lemma 4:

$$D = \prod_{i=1}^{m} \cdot B_i \text{ and } \overline{D} = \prod_{i=1}^{m} \cdot \overline{B}_i. \tag{12}$$

Proof:
Using the properties (8) and (9), and the obvious equality $$I_2^t = \underbrace{I_2 \otimes \ldots \otimes I_2}_{t \text{ times}},$$

the following is obtained:

$(F \otimes I_{2^{m-1}})(I_2 \otimes F \otimes I_{2^{m-2}})(I_4 \otimes F \otimes I_{2^{m-3}}) \ldots (I_{2^{m-1}} \otimes F)$ $= (F \otimes I_{2^{m-1}})(I_2 \otimes F \otimes I_{2^{m-2}})(I_2 \otimes (I_2 \otimes F \otimes I_{2^{m-3}})) \ldots$ $(I_2 \otimes (I_{2^{m-2}} \otimes F))$ $= F \otimes (F \otimes I_{2^{m-2}})(I_2 \otimes F \otimes I_{2^{m-3}}) \otimes \ldots \otimes (I_{2^{m-2}} \otimes F)$ $= \ldots$ $= \underbrace{F \otimes \ldots \otimes F}_{m \text{ times}} = D.$ The proof for the second equation is similar.

After taking into account equation (4), the MAP decoding algorithm 200, discussed above in conjunction with FIG. 2, can be optimized for Reed-Muller codes as indicated in MAP decoding algorithm 300, discussed hereinafter in conjunction with FIG. 3.

FIG. 3 is a flow chart describing an exemplary implementation of the MAP decoding algorithm 300 particularly suited for decoding Reed-Muller codes. As discussed hereinafter, the MAP decoding algorithm 300 for Reed-Muller codes employs matrices $B_i$ and $\overline{B}_i$ that are sparse matrices (i.e., contain many zero entries). Thus, the number of required operations and the complexity are greatly reduced.

As shown in FIG. 3, the MAP decoding algorithm 300 initially computes a vector of symbols, $$w_j^{(\alpha)},$$

having group algebra elements during step 310, based on the received signal, as follows:

$$w_j^{(\alpha)} = \begin{cases} \ln Pr(y_j | \alpha), & \text{if } Q \text{ if finite,} \\ \ln f_\alpha(y_j), & \text{if } Q \text{ is infinite,} \end{cases}$$

$0 \leq j \leq n-1, \alpha \in F_q$;

Thereafter, the sum of the logs of the probabilities of all symbols of each codeword is obtained during step 320 by multiplying the vector of symbols, $\underline{w}^T$, by a matrix, $\overline{B}_i$, associated with the Reed-Muller codeset, as follows:

For i from 1 to m do $\underline{z}^T = \overline{B}_i \underline{w}^T$;

$\underline{w} = \underline{z}$;

The obtained expression is converted to a product of the probabilities for each code word, $v_i^\alpha$, during step 330 as follows:

$$v_i^{(\alpha)} = e^{w_i^{(\alpha)}},$$

$0 \leq i \leq q^m-1; \alpha \in F_q$;

The product of the probabilities for each possible value, $\underline{v}^T$, is multiplied by the matrix $B_i$, during step 340, as follows:

For i from 1 to m do $\underline{z}^T = B_i \underline{v}^T$;

$\underline{v} = \underline{z}$;

to obtain the vector $\underline{z}^T$, indicating the probabilities for a given symbol to be each possible value.

Finally, a value is selected for each symbol, $c_j$, during step 350, by selecting the maximum value, as follows:

$c_j = \beta, 0 \leq j \leq n-1$, where $\beta$ is such that $$x_j^{(\beta)} = \max_{\alpha \in F_q} \{x_j^{(\alpha)}\};$$

To estimate the complexity of the algorithm 300, it is noted that matrices $B_i$ and $\overline{B}_i$ are sparse matrices. Any of them contains exactly q nonzero entries of the form $x^\beta, \beta \in F_q$, in each row and each column. For instance if q=3 and m=2 then $B_1$ and $B_2$ are $$B_1 = \begin{bmatrix} x^0 & x^0 & x^0 & & & & & & \\ x^0 & x^1 & x^2 & & & & & & \\ x^0 & x^2 & x^1 & & & & & & \\ & & & x^0 & x^0 & x^0 & & & \\ & & & x^0 & x^1 & x^2 & & & \\ & & & x^0 & x^1 & x^2 & & & \\ & & & & & & x^0 & x^0 & x^0 \\ & & & & & & x^0 & x^1 & x^2 \\ & & & & & & x^0 & x^2 & x^1 \end{bmatrix},$$

$$B_2 = \begin{bmatrix} x^0 & & & x^0 & & & x^0 & & \\ & x^0 & & & x^0 & & & x^0 & \\ & & x^0 & & & x^0 & & & x^0 \\ x^0 & & & x^1 & & & x^2 & & \\ & x^0 & & & x^1 & & & x^2 & \\ & & x^0 & & & x^1 & & & x^2 \\ x^0 & & & x^2 & & & x^1 & & \\ & x^0 & & & x^2 & & & x^1 & \\ & & x^0 & & & x^2 & & & x^1 \end{bmatrix}$$

Hence, a multiplication of the form $B_i \underline{w}^T$ takes $q^m(q-1)q = (q-1)qn$ summations of real numbers. Thus, the total complexity of Algorithm 300 is proportional to $q^2 n \log_q n$.

Simplification in the Binary Case

In the binary case it is possible to reduce the complexity even further by about n $\log_2 n$ operations. Let $$F_2 = \begin{bmatrix} 1 & 1 \\ 1 & -1 \end{bmatrix}.$$

The following matrices are defined:

$$B_i = I_{2^{m-i}} \otimes F_2 \otimes I_{2^{i-1}}, 1 \leq i \leq m.$$

Figure 4:
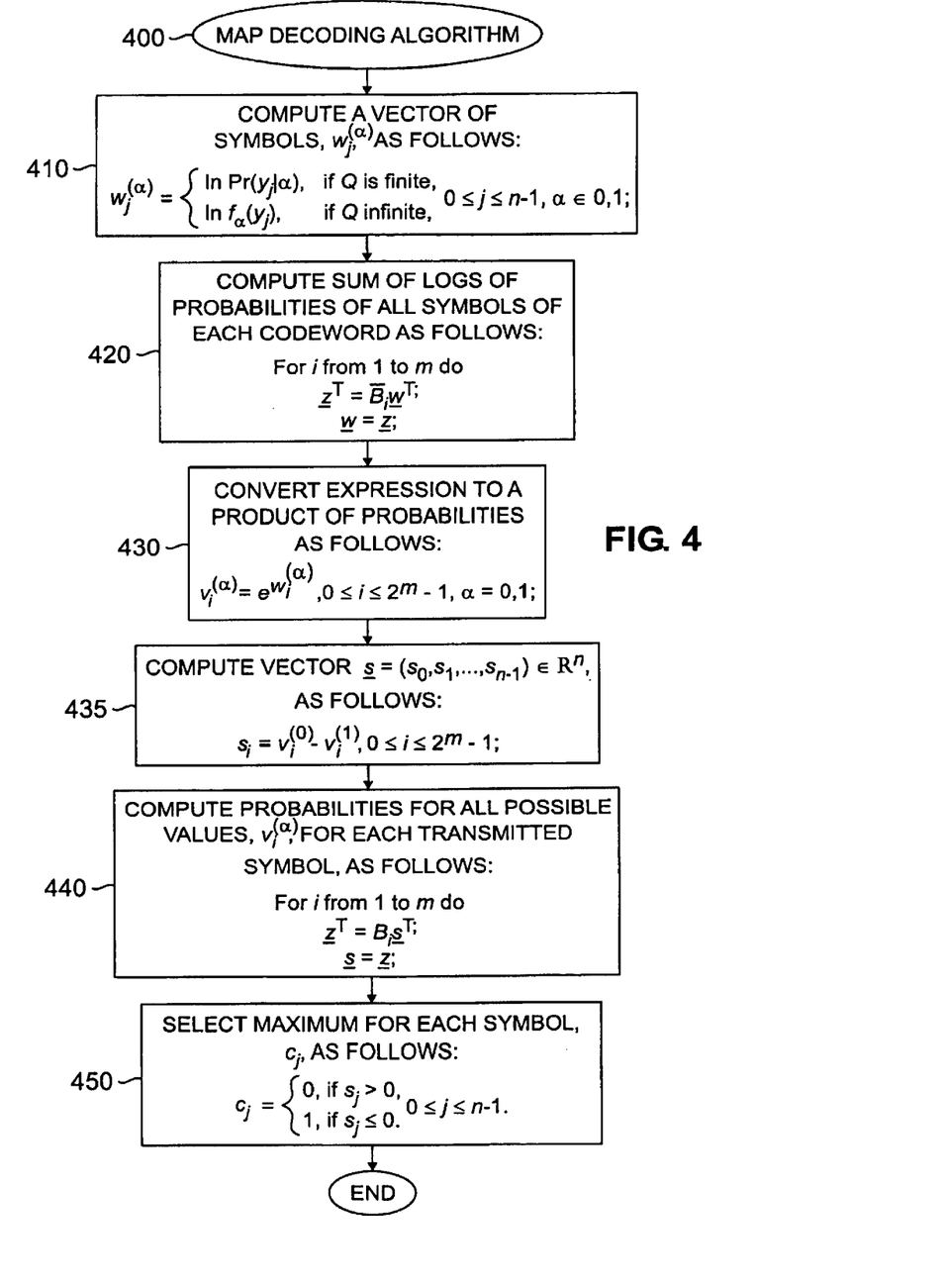
FIG. 4 is a flow chart describing an exemplary implementation of a MAP decoding algorithm particularly suited for decoding binary Reed-Muller codes.

FIG. 4 is a flow chart describing an exemplary implementation of a MAP decoding algorithm 400 particularly suited for decoding binary Reed-Muller codes. As shown in FIG. 4, the MAP decoding algorithm 400 initially computes a vector of symbols, $$w_j^{(\alpha)},$$

having group algebra elements during step 410, based on the received signal, as follows:

$$w_j^{(\alpha)} = \begin{cases} \ln Pr(y_j | \alpha), & \text{if } Q \text{ is finite,} \\ \ln f\alpha(y_j), & \text{if } Q \text{ is infinite,} \end{cases}$$

$0 \leq j \leq n-1, \alpha=0,1;$

Thereafter, the sum of the logs of the probabilities of all symbols of each codeword is obtained during step 420 by multiplying the vector of symbols, $\underline{w}^T$, by a matrix, $\overline{B}_i$, associated with the binary Reed-Muller codeset, as follows:
For i from 1 to m do $$\underline{z}^T = \overline{B}_i \underline{w}^T;$$

$$\underline{w} = \underline{z};$$

The obtained expression is converted to a product of the probabilities for each possible value, $$v_i^{(\alpha)},$$

during step 430 as follows:

$$v_i^{(\alpha)} = e^{w_i^{(\alpha)}},$$

$0 \leq i \leq 2^m-1, \alpha=0,1;$

A vector $\underline{s} = (s_0, s_1, \ldots, s_{n-1}) \in R^n$ is computed during step 435 as follows $$s_i = v_i^{(0)} - v_i^{(1)},$$

$0 \leq i \leq 2^m-1;$

The product of the probabilities for each possible value, $\underline{s}^T$, is multiplied by the matrix $B_i$, during step 440, as follows:
For i from 1 to m do $$\underline{z}^T = B_i \underline{s}^T;$$

$$\underline{s} = \underline{z};$$

to obtain the vector $\underline{z}^T$, indicating the probabilities for a given symbol to be each possible value.

Finally, a value is selected for each symbol, $c_j$, during step 450, as follows:

$$c_j = \begin{cases} 0, & \text{if } s_j > 0, \\ 1, & \text{if } s_j \leq 0. \end{cases}$$

$0 \leq j \leq n-1.$

It is noted that on the step 450 of the algorithm 400 multiplication of real valued matrices $B_i$ by real valued vectors $\underline{s}$ are performed. Such multiplications require only n summations compared to 2n on step 340 of the algorithm 300 (FIG. 3). Therefore, the complexity is reduced by about n $\log_2 n$ summations.

Using arguments similar to those described above in conjunction with the proof of Propositions 1 and 2, it is seen that after step 450 of the algorithm 400 entries of the vector $\underline{s}$ are $$s_j = \sum_{\underline{b} \in C_j^{(0)}} Pr(\underline{y}|\underline{b}) - \sum_{\underline{b} \in C_j^{(1)}} Pr(\underline{y}|\underline{b}).$$

Therefore, to make a MAP decision on the value of the j-th transmitted symbol it is enough to estimate the sign of $s_j$. Thus, the algorithm performs MAP decoding of binary first order Reed-Muller codes.

It is to be understood that the embodiments and variations shown and described herein are merely illustrative of the principles of this invention and that various modifications may be implemented by those skilled in the art without departing from the scope and spirit of the invention.

I claim:

1. A method for decoding a received vector of corrupted symbols encoded using a code set comprised of a plurality of code words, said method comprising the steps of:

representing said received vector of corrupted symbols as a vector having group algebra elements;

multiplying said vector having group algebra elements by a first matrix associated with said code set to obtain conditional probabilities for all code words;

multiplying said conditional probabilities by a second matrix associated with said code set to obtain a vector of values indicating a probability for each possible value for each symbol; and selecting a value having a maximum probability of said indicated probabilities for each possible value for each symbol.

2. The method of claim 1, wherein said conditional probabilities for all code words are products of conditional probabilities of all symbols and wherein said first multiplying step further comprises the steps of multiplying said first matrix by said vector having group algebra elements, wherein a summation of real numbers is replaced by a multiplication of said real numbers.

3. The method of claim 1, wherein said conditional probabilities for all code words are sums of logarithms of conditional probabilities of all symbols and wherein said first multiplying step of multiplying said vector, $w^T$, having group algebra elements by a first matrix, $\overline{D}$, associated with said code set to obtain conditional probabilities for all code words further comprises the step of computing $\underline{t}^T = \overline{D}\underline{w}^T$ and converting said sum of the logarithms of conditional probabilities to a product of probabilities.

4. The method of claim 1, wherein said code set is a linear code set having an element comprised of all ones.

5. The method of claim 1, wherein said code set is a Reed-Muller code set.

6. The method of claim 1, wherein said code set is a code set where said first and second matrices can each be represented as a product of sparse matrices.

7. The method of claim 1, wherein said first and second matrices have an element-wise inverse relationship.

8. A method for decoding a received vector of corrupted symbols encoded using a Reed-Muller code set comprised of a plurality of code words, said method comprising the steps of:

representing said received vector of corrupted symbols as a vector having group algebra elements;

multiplying said vector having group algebra elements by a first matrix associated with said Reed-Muller code set to obtain conditional probabilities for all code words, wherein said first matrix is a product of sparse matrices and wherein said multiplying step further comprises the step of iteratively multiplying said vector by said sparse matrices;

multiplying said conditional probabilities by a second matrix associated with said Reed-Muller code set to obtain a vector of values indicating a probability for each possible value for each symbol, wherein said second matrix is a product of sparse matrices and wherein said multiplying step further comprises the step of iteratively multiplying said conditional probabilities by said sparse matrices; and selecting a value having a maximum probability of said indicated probabilities for each possible value for each symbol.

9. The method of claim 8, wherein said conditional probabilities for all code words are products of conditional probabilities of all symbols and wherein said first multiplying step further comprises the steps of multiplying said first matrix by said vector having group algebra elements, wherein a summation of real numbers is replaced by a multiplication of said real numbers.

10. The method of claim 8, wherein said conditional probabilities for all code words are sums of logarithms of conditional probabilities of all symbols and wherein said first multiplying step of multiplying said vector, $w^T$, having group algebra elements by a first matrix, $\overline{D}$, associated with said Reed-Muller code set to obtain conditional probabilities for all code words further comprises the step of computing $\underline{t}^T = \overline{D}\underline{w}^T$ and converting said sum of the logarithms of conditional probabilities to a product of probabilities.

11. The method of claim 8, wherein said first and second matrices have an element-wise inverse relationship.

12. A system for decoding a received vector of corrupted symbols encoded using a Reed-Muller code set comprised of a plurality of code words, said system comprising:

a memory that stores computer-readable code; and a processor operatively coupled to said memory, said processor configured to implement said computer-readable code, said computer-readable code configured to:

represent said received vector of corrupted symbols as a vector having group algebra elements;

multiply said vector having group algebra elements by a first matrix associated with said Reed-Muller code set to obtain conditional probabilities for all code words;

multiply said conditional probabilities by a second matrix associated with said Reed-Muller code set to obtain a vector of values indicating a probability for each possible value for each symbol; and select a value having a maximum probability of said indicated probabilities for each possible value for each symbol.

13. The system of claim 12, wherein said conditional probabilities for all code words are products of conditional probabilities of all symbols and wherein said first means for multiplying further comprises means for multiplying said first matrix by said vector having group algebra elements, wherein a summation of real numbers is replaced by a multiplication of said real numbers.

14. The system of claim 12, wherein said conditional probabilities for all code words are sums of logarithms of conditional probabilities of all symbols and wherein said first means for multiplying said vector, $w^T$, having group algebra elements by a first matrix, $\overline{D}$, associated with said code set to obtain conditional probabilities for all code words further comprises means for computing $\underline{t}^T = \overline{D}\underline{w}^T$ and means for converting said sum of the logarithms of conditional probabilities to a product of probabilities.

15. The system of claim 12, wherein said Reed-Muller code set is a linear code set having an element comprised of all ones.

16. The system of claim 12, wherein said Reed-Muller code set is a code set where said first and second matrices can each be represented as a product of sparse matrices.

17. The system of claim 12, wherein said first and second matrices have an element-wise inverse relationship.

18. A system for decoding a received vector of corrupted symbols encoded using a Reed-Muller code set comprised of a plurality of code words, said system comprising:

a sampling device to represent said received vector of corrupted symbols as a vector having group algebra elements;

means for multiplying said vector having group algebra elements by a first matrix associated with said Reed-Muller code set to obtain conditional probabilities for all code words;

means for multiplying said conditional probabilities by a second matrix associated with said Reed-Muller code set to obtain a vector of values indicating a probability for each possible value for each symbol; and a comparator for selecting a value having a maximum probability of said indicated probabilities for each possible value for each symbol.

19. The system of claim 18, wherein said Reed-Muller code set is a linear code set having an element comprised of all ones.

20. The system of claim 18, wherein said Reed-Muller code set is a code set where said first and second matrices can each be represented as a product of sparse matrices.

* * * * *

UNITED STATES PATENT AND TRADEMARK OFFICE
CERTIFICATE OF CORRECTION

PATENT NO. : 6,990,626 B2
DATED : January 24, 2006
INVENTOR(S) : Ashikhmin

It is certified that error appears in the above-identified patent and that said Letters Patent is hereby corrected as shown below:

Column 4,
Line 61, "v,w,z" should be -- v,w,z --.

Column 5,
Line 22, "($w_o$, $w_1$,..., $w_{n-1}$)" should be -- ($\mathbf{w_o}$, $\mathbf{w_1}$,..., $\mathbf{w_{n-1}}$) --.

Column 6,
Line 3, replace "$v_i$" with -- $\underline{v}_i$ --.
Line 10, replace "$s^T =$" with -- $\underline{s}^T =$ --.

Lines 17-19, replace " $\sum_{b \in C_j^{(a)}}$ " with -- $\sum_{\underline{b} \in C_j^{(a)}}$ --.

Column 7,
Lines 29-31, replace " $\sum_{a \in F_q}$ " with -- $\sum_{\underline{a} \in F_q}$ --.

Column 9,
Line 64, replace "$= (F \otimes I_{2^{n-1}})(I_2 \otimes F \otimes I_{2^{n-2}})(I_2 \otimes (I_2 \otimes F \otimes I_{2^{n-3}}))...$" with -- $(F \otimes I_{2^{n-1}})(I_2 (\otimes F \otimes I_{2^{n-2}}))(I_2 \otimes (I_2 \otimes F \otimes I_{2^{n-3}}))...$ --.

Signed and Sealed this

Sixth Day of June, 2006

JON W. DUDAS
*Director of the United States Patent and Trademark Office*